United States Patent
Nicolson et al.

(10) Patent No.: US 10,730,152 B2
(45) Date of Patent: Aug. 4, 2020

(54) TOOL BLADES AND THEIR MANUFACTURE

(71) Applicant: C4 Carbides Limited, Newmarket (GB)

(72) Inventors: Peter Nicolson, Newmarket (GB); Jeremy Klein, Cambridge (GB)

(73) Assignee: C4 Carbides Limited, Newmarket (GB)

( * ) Notice: Subject to any disclaimer, the term of this patent is extended or adjusted under 35 U.S.C. 154(b) by 0 days.

(21) Appl. No.: 15/206,491

(22) Filed: Jul. 11, 2016

(65) Prior Publication Data
US 2017/0014959 A1    Jan. 19, 2017

(30) Foreign Application Priority Data
Jul. 15, 2015 (GB) .................................. 1512361.5

(51) Int. Cl.
*B23P 15/28* (2006.01)
*B23K 26/34* (2014.01)
(Continued)

(52) U.S. Cl.
CPC .............. *B23P 15/28* (2013.01); *B23D 61/12* (2013.01); *B23D 61/18* (2013.01); *B23D 65/00* (2013.01);
(Continued)

(58) Field of Classification Search
CPC ................ B23K 26/342; B23K 31/025; B23K 31/0056; B23K 31/20; B23K 15/0086;
(Continued)

(56) References Cited

U.S. PATENT DOCUMENTS 2,442,153 A * 5/1948 Van Der Pyl ........ B23D 61/123
125/21
3,063,310 A * 11/1962 Connoy ................. B23D 61/14
219/77
(Continued)

FOREIGN PATENT DOCUMENTS

| CN | 202079511 U | 12/2011 |
| CN | 105562825 A | 5/2016 |

(Continued)

OTHER PUBLICATIONS

United Kingdom Intellectual Property Office, Supplementary Search Report, Application No. GB1512361.5, dated May 9, 2017 (1 page).
(Continued)

*Primary Examiner* — Andrea L Wellington
*Assistant Examiner* — Fernando A Ayala
(74) *Attorney, Agent, or Firm* — Wood Herron & Evans LLP (57) ABSTRACT

There is provided a method of making a tool blade, in which a backing strip is provided, binding material in powder form is cascaded onto the backing strip, abrasive particles are provided and the binding material powder is heated by laser beam to form a binder layer which binds the abrasive particles to the backing strip. The laser beam is used to form discrete regions of binder layer as teeth. The binding material is typically braze material. A blade made according to the method is also provided.

31 Claims, 5 Drawing Sheets

(51) Int. Cl.
*B23K 31/02* (2006.01)
*B23D 61/18* (2006.01)
*B23D 65/00* (2006.01)
*B23D 61/12* (2006.01)
*B23K 15/00* (2006.01)
*B33Y 10/00* (2015.01)
*B33Y 50/02* (2015.01)
*B33Y 80/00* (2015.01)
*B23K 1/20* (2006.01)
*B23K 35/02* (2006.01)
*B23K 1/005* (2006.01)
*B23K 35/30* (2006.01)
*C23C 14/06* (2006.01)
*C23C 14/22* (2006.01)
*B23K 101/34* (2006.01)
*B23K 103/00* (2006.01)
*B23K 101/20* (2006.01)

(52) U.S. Cl.
CPC .............. *B23K 1/0056* (2013.01); *B23K 1/20* (2013.01); *B23K 15/0086* (2013.01); *B23K 26/34* (2013.01); *B23K 31/025* (2013.01); *B23K 35/0244* (2013.01); *B23K 35/3033* (2013.01); *B33Y 10/00* (2014.12); *B33Y 50/02* (2014.12); *B33Y 80/00* (2014.12); *C23C 14/0611* (2013.01); *C23C 14/0635* (2013.01); *C23C 14/0647* (2013.01); *C23C 14/22* (2013.01); *B23K 2101/20* (2018.08); *B23K 2101/34* (2018.08); *B23K 2103/52* (2018.08)

(58) Field of Classification Search
CPC ............... B23K 15/0056; B23K 26/34; B23K 35/0244; B23K 35/3033; B23K 2101/20; B23K 2101/34; B23K 2103/52; B23P 15/28; B33Y 10/00; B33Y 50/02; B33Y 80/00; B23D 61/12; B23D 61/18; B23D 65/00; C23C 14/0611; C23C 14/0635; C23C 14/0647; C23C 14/22
USPC .......................................................... 76/112
See application file for complete search history.

(56) References Cited

U.S. PATENT DOCUMENTS

| | | | |
|---|---|---|---|
| 4,919,974 A | * | 4/1990 | McCune ................. C22C 26/00 427/122 |
| 8,096,221 B2 | | 1/2012 | Tarrerias |
| 9,254,527 B2 | | 2/2016 | Vaneecke et al. |
| 2003/0084894 A1 | | 5/2003 | Sung |
| 2007/0163128 A1 | | 7/2007 | Tarrerias |
| 2010/0122620 A1 | * | 5/2010 | Ruthven ............... B23D 61/026 83/835 |
| 2010/0275522 A1 | * | 11/2010 | Kasashima .......... B23D 61/028 51/295 |
| 2013/0205676 A1 | * | 8/2013 | Tian .................... B24B 27/0633 51/295 |
| 2013/0333681 A1 | | 12/2013 | Vaneecke et al. |
| 2014/0000579 A1 | * | 1/2014 | Vaneecke ............... B23D 65/00 125/21 |
| 2016/0333705 A1 | * | 11/2016 | Uihlein ................. C23C 14/022 |

FOREIGN PATENT DOCUMENTS

| | | |
|---|---|---|
| EP | 1332822 A1 | 8/2003 |
| EP | 2138263 A2 | 12/2009 |
| GB | 1475412 A | 6/1977 |
| GB | 1513667 A | 6/1978 |
| GB | 2443252 A | 4/2008 |
| KR | 20050051014 A | 6/2005 |
| WO | 2010059835 A2 | 5/2010 |
| WO | 2015128140 A1 | 9/2015 |

OTHER PUBLICATIONS

European Patent Office, English Machine Translation of KR20050051014A, published Jun. 1, 2005, retrieved from https://worldwide.espacenet.com on Jul. 27, 2016 (1 page).
United Kingdom Intellectual Property Office, Patents Act 1977: Search Report under Section 17, Application No. GB1512361.5, dated Jul. 25, 2016 (2 pages).
Espacenet, English Machine Translation of Abstract for EP1332822A1, dated Aug. 6, 2003, retrieved from https://worldwide.espacenet.com on Nov. 29, 2016 (1 page).
Espacenet, English Machine Translation of Abstract for CN105562825A, dated May 11, 2016, retrieved from https://worldwide.espacenet.com on Nov. 29, 2016 (1 page).
European Patent Office, European Search Report, Application No. EP16175555, dated Nov. 11, 2016 (2 pages).

* cited by examiner

TOOL BLADES AND THEIR MANUFACTURE

CROSS-REFERENCE TO RELATED APPLICATIONS

The present application claims priority under 35 U.S.C. § 119 of Great Britain Patent Application No. 1512361.5, filed Jul. 15, 2015, the disclosure of which is hereby incorporated herein by reference in its entirety.

FIELD OF THE INVENTION

The present invention relates to tool blades and to methods of making tool blades.

SUMMARY OF THE INVENTION

Examples of the present invention provide a method of making a tool blade, in which:
a. a backing strip is provided;
b. binding material in powder form is cascaded onto the backing strip;
c. abrasive particles are provided; and
d. the binding material powder is heated by a beam of radiation to form a binder layer which binds the abrasive particles to the backing strip.

The radiation beam may be scanned relative to the blade. The radiation beam may be used to form discrete regions of binder layer as teeth along the blade.

The radiation may be laser radiation.

The binder layer may be formed with at least one characteristic which changes between the region bound to the backing strip and a region bound to abrasive particles.

At least one formation condition for the formation of the binder layer may be varied as the binder layer is being formed, to form a binder layer with at least one characteristic which changes.

The or each formation condition may be varied continuously while at least part of the binder layer is being formed, to provide a binder layer with at least one characteristic which changes continuously across that part of the binder layer. Alternatively, the or each formation condition may be varied in step fashion while at least part of the binder layer is being formed, to provide a binder layer with at least one characteristic which changes in step fashion across that part of the binder layer. At least one of the following formation conditions may be varied while the binder layer is being formed:
(a) the composition of the binding material;
(b) the temperature at the binder layer surface;
(c) the intensity of the radiation;
(d) the duration of the radiation;
(e) the duty cycle of the radiation, when the radiation is pulsed;
(f) the frequency or wavelength of the radiation;
(g) the focus position of the radiation;
(h) the shape or size of the focus of the radiation;
(i) the incident or drag angle of the radiation; and
(j) the scanning speed of the radiation.

The binding material may be composed of two or more powders, the composition of the binding material being variable by delivering the powders in varying ratios. The binding materials may be provided as a mixture for delivery together. The binding materials may be delivered separately. Regions of the binder layer may be composed of a single binding material.

The binding material may include a ductile braze material. The ductile braze material may be provided in combination with a binder material. The ductile braze material may be provided in the region of the binding layer which is bonded to the backing strip to provide a stress resistant bond with the backing strip. The ductile region may include abrasive particles.

The binding material may include a material having thermal properties able to absorb differential thermal expansion within the binder layer materials, during use of the blade. The thermal material may be provided in an intermediate region of the binding layer, between the region which is bonded to the backing strip, and the region which is exposed during use of the blade. The intermediate region may include abrasive particles.

The binding material may include a hard braze material. The hard braze material may be a nickel braze material. The hard braze material may be provided in the region of the binding layer which is exposed during use of the blade, and which includes abrasive particles.

The abrasive particles may be mixed with the binding material for delivery. The abrasive particles may be delivered separately from the binding material. The abrasive particles may be delivered only when the binder layer is sufficiently fully formed to leave the abrasive particles exposed at the edge of the finished blade.

The abrasive particles may be a super abrasive material. A mixture of abrasive particles of different materials may be used. The abrasive particles may be cubic boron nitride, diamond or tungsten carbide. The abrasive particles may be coated to promote binding with the binding layer. The abrasive particles may be coated by a physical vapour deposition or chemical vapour deposition technique. The abrasive particles may be coated with a material which promotes wetting of the abrasive particles by the binding material.

The binding material may include a constituent which has a characteristic tuned to the radiation, to promote rapid heating within the binding material when exposed to the radiation. The radiation may be tuned to an absorption peak of the tuned constituent.

The formation condition or conditions may be varied to vary an adhesive or bonding property and/or a thermal property and/or a mechanical property of the binder layer. The shear modulus of the binder layer may be varied.

The backing strip may be steel. The backing strip may be formed with tooth roots along the edge of the strip, prior to the formation of the binder layer.

Examples of the present invention also provide a computer-readable medium having computer-executable instructions adapted to cause a 3D printer to print a tool blade in accordance with the method set out above.

Examples of the present invention also provide a tool blade, comprising:
a. a backing strip;
b. binding material forming a binder layer;
c. and abrasive particles bound to the backing strip by the binder layer; wherein:
d. the binder layer having at least one characteristic which changes between the region bound to the backing strip and the region bound to abrasive particles.

The binder layer may form teeth along the edge of the finished blade.

The or each characteristic may vary continuously across at least part of the binder layer. Alternatively, the or each characteristic may vary in step fashion across at least part of the binder layer.

The binding material may include a ductile braze material. The ductile braze material may be in combination with a binder material. The ductile braze material may be in the region of the binding layer which is bonded to the backing strip to provide a stress resistant bond with the backing strip. The ductile region may include abrasive particles.

The binding material may include a material having thermal properties able to absorb differential thermal expansion within the binder layer materials, during use of the blade. The thermal material may be in an intermediate region of the binding layer, between the region which is bonded to the backing strip, and the region which is exposed during use of the blade. The intermediate region may include abrasive particles.

The binding material may include a hard braze material. The hard braze material may be a nickel braze material. The hard braze material may be in the region of the binding layer which is exposed during use of the blade, and which includes abrasive particles.

The abrasive particles may be exposed at the edge of the finished blade.

The abrasive particles may be a super abrasive material. A mixture of abrasive particles of different materials may be used. The abrasive particles may be cubic boron nitride, diamond or tungsten carbide. The abrasive particles may be coated to promote binding with the binding layer. The abrasive particles may be coated by a physical vapour deposition or chemical vapour deposition technique. The abrasive particles may be coated with a material which promotes wetting of the abrasive particles by the binding material.

The binding material may include a constituent which has a characteristic tuned to promote rapid heating within the binding material when irradiated.

The characteristic which changes may be an adhesive property and/or a thermal property of the binder layer.

The backing strip may be steel. The backing strip may have tooth roots along the edge of the strip, prior to the formation of the binder layer.

BRIEF DESCRIPTION OF THE DRAWINGS

Examples of the present invention will now be described in more detail, by way of example only, and with reference to the accompanying drawings, in which.

DETAILED DESCRIPTION OF THE INVENTION

Figure 1:
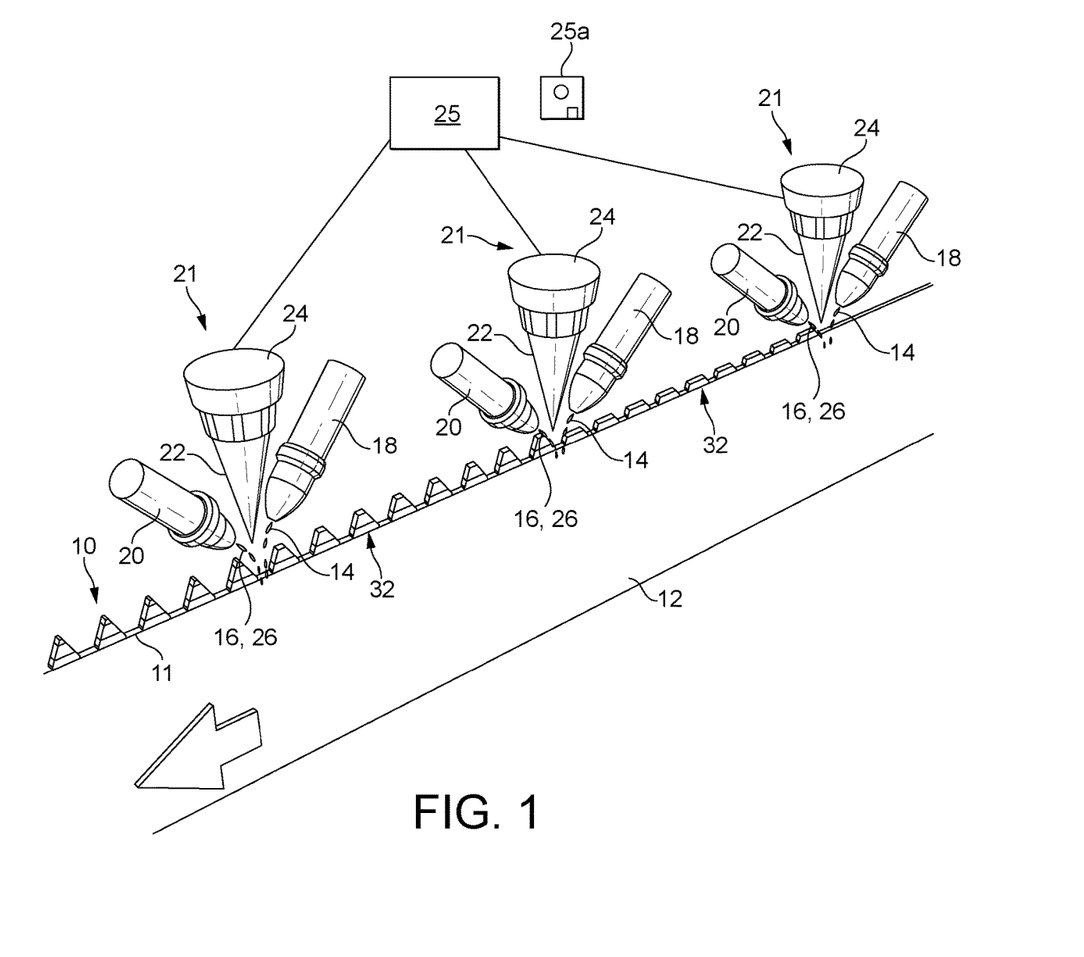
FIG. 1 is a schematic diagram illustrating an example of a method in accordance with the present invention.

FIG. 1 illustrates a method of making a tool blade indicated generally at 10 in FIG. 1, but with detail removed in the interests of clarity. In this example, a backing strip 12 is provided. Binding material 14, 16 in powder form is cascaded onto the backing strip 12 from sources indicated as hoppers 18, 20. In this example, this occurs at multiple workstations 21 as the backing strip 12 is moving past them. Three workstations are shown, each having two hoppers 18, 20. Other numbers of workstations and hoppers could be chosen.

The binding material powder 14, 16 and the backing strip 12 are heated in each workstation 21 by a beam of radiation 22 from a radiation source 24 to form a binder layer (to be described). Abrasive particles 26 are also provided from a source which may be one of the hoppers 18, 20 or another hopper. The abrasive particles are to be bound to the backing strip 12. This is achieved by the binder layer being formed.

Formation condition for the formation of the binder layer may be varied as the binder layer is being formed, as will be described. This results in the formation of a binder layer with at least one characteristic which changes between the region bound to the backing strip 12 and the region bound to the abrasive particles 26.

Apparatus Used in the Method

In more detail, FIG. 1 illustrates a backing strip 12 in the form of a long steel strip suitable for use as a tool in the form of a linear edge blade for band saws, hacksaws, jigsaws, reciprocating saws, hole saws and other similar tools, after treatment to create a cutting edge along the edge of the strip 12. Other materials could be used for the backing strip 12.

The edge 11 of the strip 12 is presented sequentially to the workstations 21, for the formation of the blade 10. Alternatively, multiple operations could be effected at a single workstation. The workstations 21 include one or more hoppers 18, 20 for providing material in the form of powder cascaded onto the edge 11 of the strip 12. In this example, two separate hoppers 18, 20 are illustrated and will be described as supplying respective binding materials, so that these binding materials can be supplied separately or together to the edge 11 of the strip 12. In other examples, there may be only a single source of a single binding material. There may be more than two binding materials available. Binding materials may be supplied by respective sources or from one or more combined sources. The hoppers 18, 20 include arrangements (not shown) to control the delivery of material. The rate of delivery may be controlled, and the delivery may be controlled to start and stop.

At least one of the workstations 21 includes a hopper charged with abrasive particles 26, to provide these to the edge 11 of the strip 12. The abrasive particles 26 may be cubic boron nitride, diamond or tungsten carbide or another super abrasive material. The abrasive particles 26 may be coated to promote binding with the binding layer to be formed, as will be described. The abrasive particles 26 may be coated by a physical vapour deposition technique or a chemical vapour deposition technique. The abrasive particles 26 may be coated with a material which promotes wetting of the abrasive particles by one or more of the binding materials available from the sources 18, 20. The control arrangements of the hoppers 18, 20 allow the delivery of abrasive particles 26 to be controlled. The rate of delivery may be controlled, and the delivery may be controlled to start and stop. FIG. 1 illustrates a source of abrasive particles 26 which is combined with the source of one or more of the binding materials 16, but a separate hopper for providing abrasive particles 26 may be provided.

The workstations 21 also include a radiation source 24. In this example, each radiation source 24 is a laser light source. Other types of radiation source could alternatively be used, such as electron beams, plasma beams and others. The purpose of the radiation source 24 is to create heating in the binding materials 14, 16, at the edge 11 of the strip 12, in order to form a binder layer, as will be described. Accordingly, a choice of radiation source 24 can be made by considering the nature of the binding material 16, the material of the backing strip 12 and the material of the abrasive particles 26, in order to achieve the results which will be described.

The workstations 21 may be fixed in position, with a feed mechanism (not shown) being provided to feed the strip 12 past the workstations 21. This may be done in a continuous or stepwise fashion. Alternatively, or in addition, the workstations 21 (and in particular, the lasers 24) may be arranged to scan along the edge 11 of the strip 12 or toward and away from the edge of the strip 12, either by mechanical means or by optical means. The lasers 24 may also be arranged to provide variable intensity, pulses of variable duration, streams of pulses which have a variable duty cycle (the ratio between the length of on periods and the length of off periods). The frequency or wavelength of the radiation may be varied. The focus position or the shape or size of the focus of the radiation beam may be varied. The incident angle or drag angle of the radiation relative to the strip 12 may be varied. The scanning speed of the radiation, relative to the strip 12, may be varied. These or other variations may be used to create controllable heating effects in the strip 12. This allows the temperature to be controlled at the surface of the binder layer being formed, as will be described.

It can readily be understood, and seen in FIG. 1, that pulsing the operation of the workstations 21 allows a line of teeth to be formed along the edge 11 of the blade 10.

The workstations 21 may be controlled by a computing device 25. Consequently, there may be computer-executable instructions adapted to cause the workstations 21 to perform as a 3D printer system to print an abrasive tool blade in accordance with the method being described herein, the instructions being in a computer-readable medium either within the device 25, or removable from the device 25, as illustrated at 25*a*.

Formation of a Binder Layer

Figure 2A:
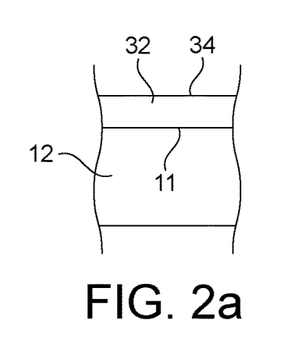
FIGS. 2a, 2b and 2c illustrate a tool blade at various stages during its production by the method illustrated in FIG. 1.
Figure 2B:
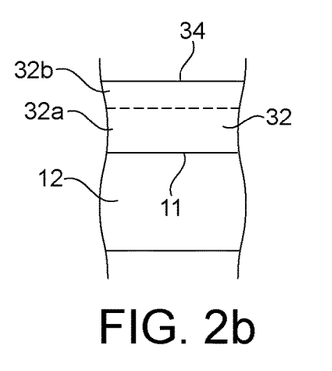
Figure 2C:
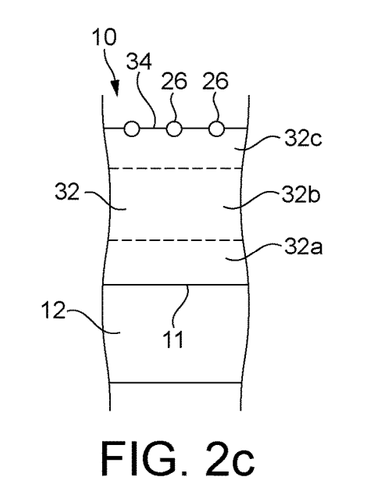

FIG. 2 illustrates a backing strip 12 on an enlarged scale as compared with FIG. 1 and at various stages as a binder layer 32 is formed, and abrasive particles 26 are provided and become bound to the backing strip 12 by the binder layer 32.

FIG. 2 (*a*) illustrates the situation as the binder layer 32 is beginning to form. This may be the process at the first workstation 21. At this stage, binding material (not shown) is being cascaded onto the edge 11 of the strip 12 and the laser 24 is being used to illuminate the edge 11 of the strip 12 and the binding material. This has the effect of creating heating. The heating effect causes the binding material to bind to the backing strip 12. In one example, the binding material and/or the backing strip 12 become molten, to achieve a welding effect between the materials.

The binding material delivered at the first workstation 21 (or during the first stage of forming the binding layer 32) may consist of or include a ductile braze material. The ductile braze material may be provided in combination with a binder material. The heating effect causes the ductile braze material to become bonded with the strip 12. It is a desired function of the ductile braze material to form a stress resistant root for the binder layer 32 and a stress resistant bond with the strip 12. Abrasive particles may be incorporated within the ductile root, but may be omitted because the material of the ductile root is unlikely to be exposed to a workpiece during normal use of the blade.

During this early stage, the formation conditions by which the binder layer 32 begins to form are controlled so that bonding between the binder layer 32 and the backing strip 12 is encouraged. Formation conditions can be set by varying several different parameters. It is not necessary to provide for variation of all of these parameters. An appropriate choice can be made according to the nature of the radiation source 24, the nature of the materials 16, 26 and the nature of the material of the backing strip 12. In one example, the composition of the binding material 16 which is being cascaded onto the edge 11 is selected to create, initially, a blend which has enhanced characteristics of binding with the material of the backing strip 12. This may be achieved by selecting one of the binding materials 16 available from the hoppers 18, 20, or by selecting a particular blend of binding materials 16, or by separately varying the rate of delivery of the different binding materials.

Other parameters could be varied to encourage binding with the material of the backing strip 12. For example, the radiation source 24 may be operated to control the temperature achieved at the edge 11. The intensity of radiation may be varied. The edge 11 may be illuminated by the radiation for a period of time whose duration is controlled and selected to encourage binding. The radiation may be pulsed by a duty cycle which is variable and controlled, and which is selected to encourage binding.

As this process continues, the binder layer 32 will become thicker, as illustrated at FIG. 2 (*b*). At this stage, the operation of the first workstation 21 is complete and the illustrated region strip 12 has moved to the second workstation 21. Binding material from the second workstation is now laid down on a binder layer 32 of significant thickness and is therefore required to bind with the ductile root of the binding layer 32, rather than with the material of the backing strip 12. Accordingly, at this stage of the process, one or more of the parameters described above is varied to create formation conditions which encourage the binding material to bind with the root 32*a* of the binding layer 32, which has already been laid down.

At this stage, the binding material may include a material having thermal properties able to absorb differential thermal expansion within the binder layer being formed. Various thermal issues will arise during use. It is a desired function of intermediate regions to absorb differential thermal expansion. Abrasive particles may be incorporated within the intermediate region, but may be omitted because the material of the intermediate region is unlikely to be exposed to a workpiece during normal use of the blade.

In these first two stages of the process, abrasive particles 26 are not necessarily provided to the edge 11, in this example. This avoids abrasive particles becoming embedded deep within the binder layer 32, where they are unlikely to contribute to the effectiveness of the finished blade. However, when the binder layer 32 is approaching the desired thickness (FIG. 2 (*c*)), the provision of abrasive particles 26 takes place. This takes place in the third workstation. Specifically, the abrasive particles 26 are not delivered in this example until the binder layer 32 is sufficiently fully formed to leave the abrasive particles exposed at, or very close to, the finished tool edge or the crown of the tooth, as illustrated in FIG. 2 (*c*). The abrasive particles 26 are cascaded to the edge 11 in the third workstation 21, in the manner described above, so that they become embedded in, and become bound with the binder layer 32 at the exposed edge 34 of the binder layer 32 by the action of the laser 24. At this third stage of the process, one or more of the parameters described above is varied to create conditions which encourage the binding material to bind with the abrasive particles 26.

In this third stage, for forming the crown of the tooth or the exposed edge of the blade the binding material may include a hard braze material. The hard braze material may be a nickel braze material. A desired function of the hard braze material or other binding material used in the exposed region is to create a hard tooth tip or blade edge, which is also abrasive by virtue of the presence of the abrasive particles 26 and the quality of their bond with binder layer 32.

It is to be understood by the reader that the formation conditions which create a strong bond between the binder layer 32 and the backing strip 12 are expected to differ from the formation conditions which create a strong bond between the binder layer 32 and the abrasive particles 26. The formation conditions which create the intermediate region described above are expected to differ from the formation conditions at the root or edge of the binder layer 32. The purpose of varying the formation conditions in the manner which has been described is to encourage the formation of a strong bond between the root 32a of the binder layer 32 and the backing strip 12, and also to form a strong bond between the crown or edge 32c of the binder layer 32 and the abrasive particles 26, and also to allow the intermediate layer 32b to absorb thermal expansion and contraction, to act as a buffer between the root 32a and the crown/edge 32c.

Figure 3:
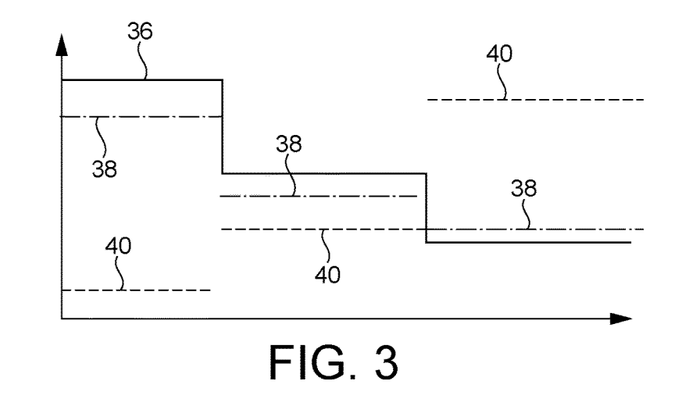
FIGS. 3 and 4 illustrate the significance of changes made within the method of FIG. 1.

Changing the formation conditions will result in the change of at least one characteristic between the root of the binder layer 32, where the binder layer 32 is bound to the backing strip 12, and the exposed edge of the binder layer 32, where the binder layer 32 is bound to the abrasive particles 26. This is illustrated in FIG. 3. The horizontal axis of FIG. 3 represents distance through the binder layer 32, away from the backing strip 12. The vertical axis of FIG. 3 represents a value of three measurements to be described (with arbitrary units). The first measurement is illustrated with a solid line 36 and represents a measurement of the speed, scanning dwell time or intensity of the laser 24, which in turn results in a variable temperature at the exposed edge of the binder layer 32. Initially, near the root of the binder layer 32, the laser 24 is control to create a relatively high temperature. As the thickness of the binder layer 32 increases, the laser 24 is controlled to create a progressively lower temperature. It can be seen from FIG. 3 that the variation changes in step-wise fashion while the whole of the binder layer 32 is being formed.

Alternatively, the solid line 36 may represent the composition of the binder material, indicating that the composition changes as the binder layer is being formed, thereby changing the characteristics of the binder layer.

FIG. 3 also illustrates a second measurement with a chain dotted line 38. This represents the ability of the binder material to bind with the material of the backing strip 12 and to provide the ductile function described above. Initially (close to the backing strip 12), this measurement is high. As the thickness of the binder layer 32 increases, and as the laser 24 is controlled to change the formation conditions as described above or the composition of the binder material is changed, the formation of the binder layer 32 results in a reducing ability to bind with the backing strip 12 and a reduction in the ductility. However, this is less necessary as the thickness of the binder layer 32 increases.

FIG. 3 also illustrates a third measurement with a broken line 40. This represents the ability of the binder material to bind with the abrasive particles 26, and to provide the hard crown/edge described above. Initially (close to the backing strip 12), this measurement is low, because the material of the binder layer 32 is primarily required to bind with the backing strip 12, rather than with the abrasive particles 26. As the thickness of the binder layer 32 increases, and as the laser 24 is controlled to change the formation conditions as described above or the composition of the binder material is changed, the formation of the binder layer 32 results in an increasing ability to bind with the abrasive particles 26 and an increase in hardness. This is necessary as the thickness of the binder layer 32 increases, near the final thickness (FIG. 2 (c)) when the abrasive particles 26 are forming the crown 32(a).

In an intermediate region, the characteristics are shown to be those required for the intermediate layer 32b, i.e., the thermal buffer characteristics described above. In this region, bonding with the backing strip 12 is not required, and hardness for forming a crown/edge is not required.

Figure 4:
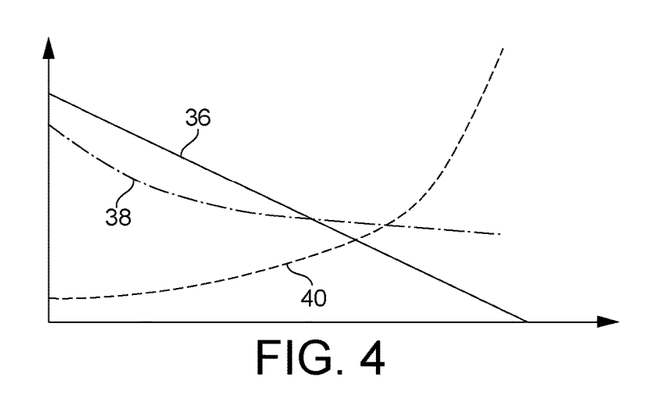

FIG. 4 illustrates an alternative example in which a formation condition is varied in a continuous fashion. FIG. 4 illustrates the same three measurements as FIG. 3, except that in FIG. 4, the formation conditions are varied in a continuous fashion, resulting in continuous changes in the two measurements.

Figure 5:
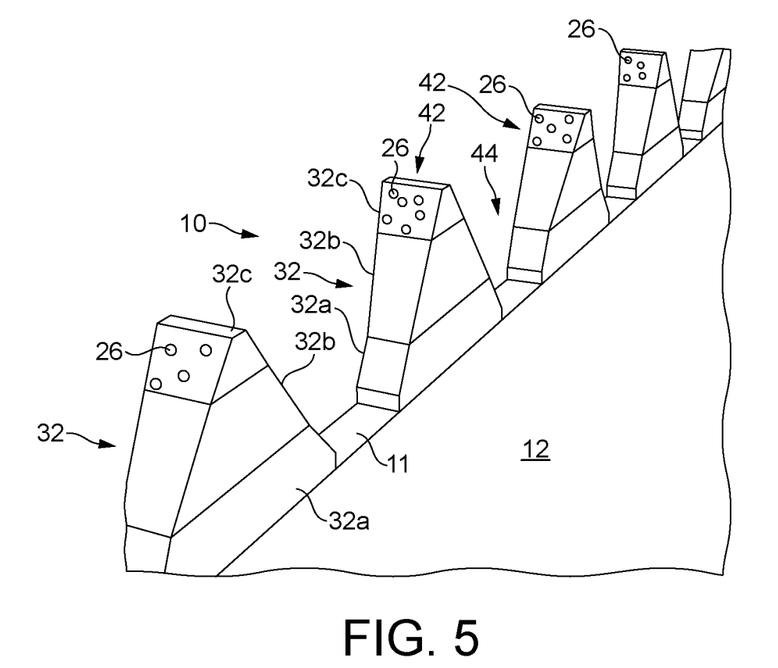
FIG. 5 illustrates the edge of a blade formed as described.

Stepwise changes in formation conditions will have the result of creating a binder layer 32 or tooth in the form of a series of layers 32a, 32b, 32c whose properties change at the boundaries between adjacent layers. These layers are schematically illustrated in FIG. 5, which shows a line of teeth 42 formed along the edge 11 and each having three distinct layers (as illustrated, but not necessarily distinguishable by eye). Each tooth 42 has a root 32a made of a combination of ductile, braze and binder matrix, with optional abrasive material. The root 32a is formed in the first workstation 21, as described above. Pulsing the laser 24 creates separation along the edge 11, creating teeth 42 and gullets or gaps 44 between teeth 42. On top of the root 32a, each tooth 42 has an intermediate layer 32b, providing the thermal properties described, particularly the ability to absorb differential thermal expansion characteristics of root 32a and the crown 32c. The intermediate layer 32b is formed in the second workstation 21, as described above. Each tooth 42 is tipped by a crown 32c which includes hard braze material, such as a nickel braze material, to provide a strong bond with the abrasive particles, resulting in a hard-tipped tooth 42. The tooth 32c is formed in the third workstation 21, as described above.

Alternatively, the use of continuous changes in formation conditions will have the result of creating a binder layer 32 in the form of a continuum whose properties change continuously through the body of the binder layer 32.

The use of varying formation conditions (including changing the material composition of the layer) to vary the adhesive or bonding properties has been emphasised. Other properties could be varied in this manner, such as the thermal or mechanical properties of the binder layer 32, as described. For example, the binder layer 32 may be given different thermal properties to cope with the higher temperatures likely to be experienced during use, in the vicinity of the abrasive particles 26, as compared with the thermal properties closer to the root of the binder layer 32, where lower temperatures are likely to be experienced. The intermediate layer 32b provides a buffer between these regions. The shear modulus of the binder layer 32 may be varied.

It can readily be understood from FIG. 5 that by appropriate operation of the laser 24, the teeth 42 can be built with a wide variety of shapes and sizes, and with a built-in set.

Finished Blade

Figure 6:
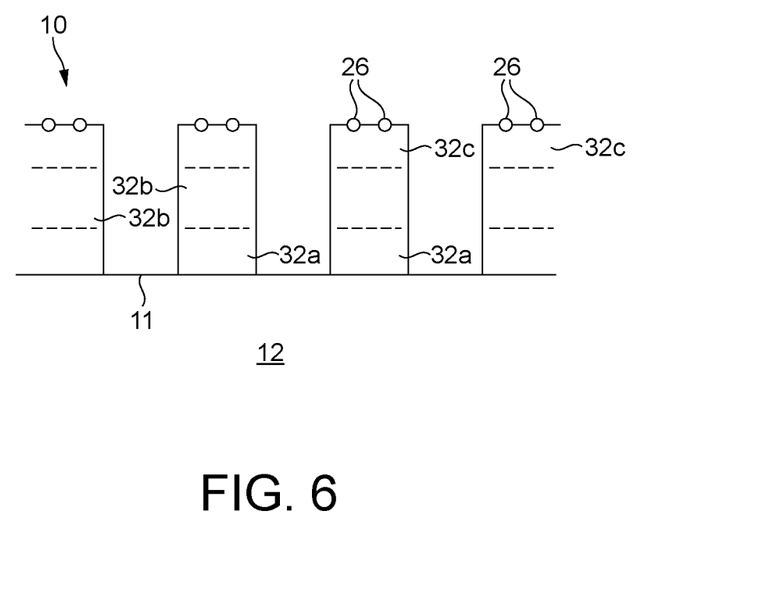
FIGS. 6 and 7 are highly schematic views of tool blades formed by the methods described.

FIG. 6 illustrates one example of a finished blade 10 achieved by means of the methods described above. In this example, the backing strip 12 is coated along one edge 11 by the binder layer 32, which forms teeth 42 in this example and gaps 44, and which has abrasive particles 26 embedded in the teeth 42 and exposed at the tips of the teeth. The result is a tool blade 10 in which the abrasive particles 26 are presented for working a workpiece, and are securely held in position by the binder layer 32, which acts as an interface between the abrasive particles 26 and the backing strip 12. As has been described, the material of the binder layer 32 can be considered as a functionally graded material. The layer 32 has at least one characteristic which changes between the region 32a bound to the backing strip 12 and the region 32c bound to the abrasive particles 26. In this example, the region 32a is formed to encourage binding with the backing strip 12 and is ductile, and the region 32c is formed to encourage binding with the abrasive particles 26 and is hard. The intermediate region 32b provides a buffer for thermal effects.

Figure 7:
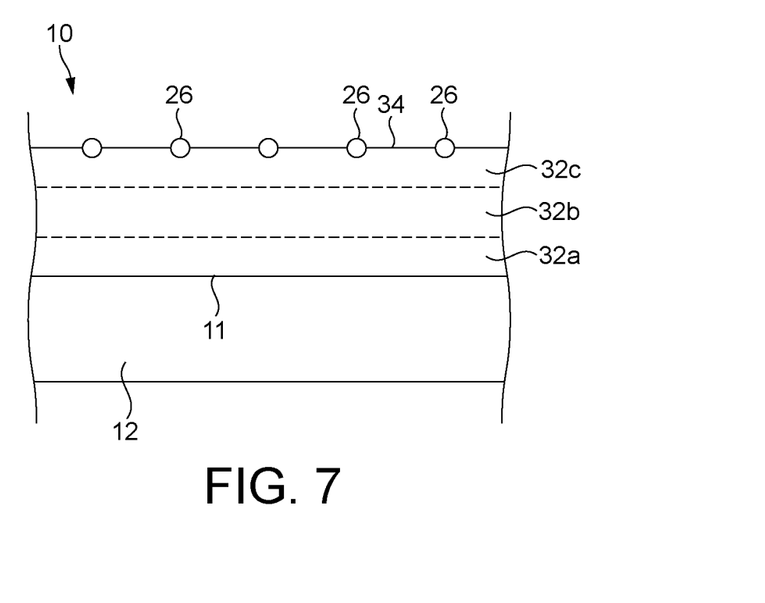

FIG. 7 illustrates a further example of a finished blade 10 achieved by means of the methods described above. This example differs from example of FIG. 5 only in that the binder layer 32 is provided continuously along the edge 11 of the strip 12. Each position along the blade will have the binder layer structure described above and will exhibit the properties of enhanced bonding with the backing strip 12, ductility, enhanced bonding with the abrasive particles 26, hardness and intermediate thermal buffering, for the reasons explained above.

Figure 8:
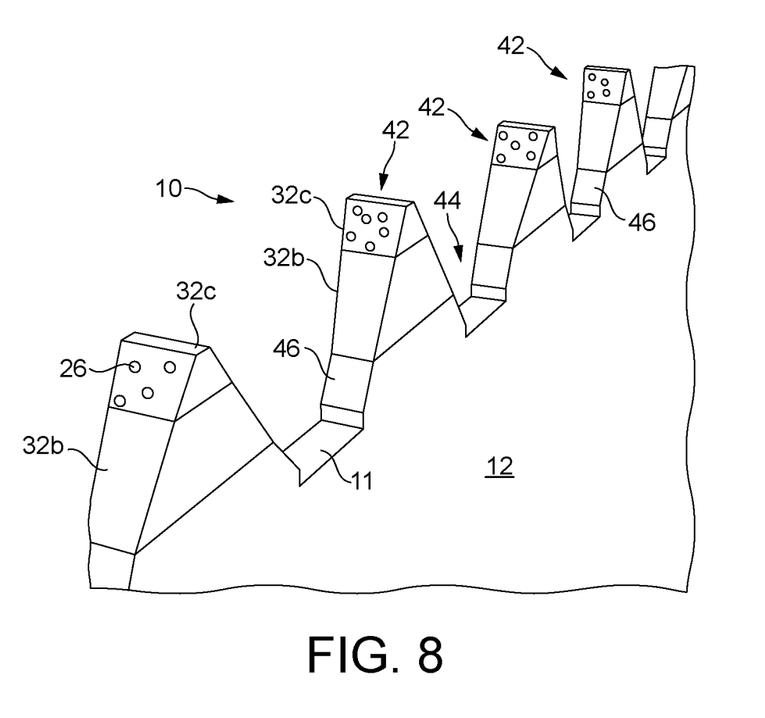
FIG. 8 corresponds with FIG. 5, showing an alternative blade.

FIG. 8 shows a further example of a finished blade. This differs from the example of FIG. 5 only in that the strip 12 is pre-formed, e.g., by punching, to have tooth roots 46 along its edge. The binder layer 32 is built on the roots 46, as described above, to form teeth 42 which have gullets 44 extending into the gaps between the roots 46. This allows various tooth forms to be built on pre-formed tooth roots.

Materials Used

Having understood the nature of the method described above, the reader will be aware of various different materials which could be used in the method above.

The binding materials may be used in the form of single materials or combinations of materials. In one example, one of the binding materials may include a constituent which has a characteristic tuned to the radiation. For example, the constituent may have an absorption peak at the wavelength of the illuminating laser light from the source 24. Alternatively, the laser 24 may be tuned to the absorption peak. This will promote rapid absorption of energy from the radiation source 24 by the constituent within the binding material, thereby promoting rapid heating within the binding material. This is expected to provide enhanced control of the formation conditions and/or enhanced production rates.

The abrasive particles may be super abrasive materials such as cubic boron nitride, diamond, tungsten carbide or another super abrasive material. A mixture of abrasive particles of different materials can be used. The abrasive particles may be coated prior to their introduction, by means of a coating which promotes binding with the binding layer 32. Examples include coating with a material which promotes wetting of the abrasive particles by the binding material. Coatings may be applied to the abrasive particles by a physical vapour deposition technique or by a chemical vapour deposition technique.

Many variations and modifications can be made to the techniques and apparatus described above, without departing from the scope of the present invention set forth herein. For example, many different materials, or combinations of materials, shapes, sizes, relative shapes and relative sizes of structures can be chosen.

While endeavoring in the foregoing specification to draw attention to those features of the present invention believed to be of particular importance it should be understood that the Applicant claims protection in respect of any patentable feature or combination of features hereinbefore referred to and/or shown in the drawings whether or not particular emphasis has been placed thereon.

The invention claimed is:

1. A method of making a tool blade, comprising:
   providing a backing strip;
   cascading binding material, including a ductile braze material, in powder form onto the backing strip;
   providing abrasive particles; and
   heating the binding material powder by a beam of radiation to form a binder layer which binds the abrasive particles to the backing strip;
   wherein the radiation beam is used to form discrete regions of binder layer as teeth along an edge of the blade; and
   at least one formation condition for the formation of the binder layer is varied as the binder layer is being formed to form teeth, each tooth formed with a ductile region bonded to the backing strip, a crown and an intermediate region of thermal material disposed between the ductile region and the crown so as to absorb thermal expansion and contraction.

2. The method according to claim 1, wherein the radiation beam is scanned relative to the blade.

3. The method according to claim 1, wherein the radiation is laser radiation.

4. The method according to claim 1, wherein the or each formation condition is varied continuously while at least part of the binder layer is being formed.

5. The method according to claim 1, wherein the or each formation condition is varied in step fashion while at least part of the binder layer is being formed.

6. The method according to claim 1, wherein at least one of the following formation conditions is varied while the binder layer is being formed:
   (a) the composition of the binding material;
   (b) the temperature at the binder layer surface;
   (c) the intensity of the radiation;
   (d) the duration of the radiation;
   (e) the duty cycle of the radiation, when the radiation is pulsed;
   (f) the frequency or wavelength of the radiation;
   (g) the focus position of the radiation;
   (h) the shape or size of the focus of the radiation;
   (i) the incident or drag angle of the radiation; and
   (j) the scanning speed of the radiation.

7. The method according to claim 1, wherein the binding material is composed of two or more powders, the composition of the binding material being variable by delivering the powders in varying ratios.

8. The method according to claim 7, wherein the binding materials are provided as a mixture for delivery together.

9. The method according to claim 7, wherein the binding materials are delivered separately.

10. The method according to claim 1, wherein regions of the binder layer are composed of a single binding material.

11. The method according to claim 1, wherein the ductile braze material is provided in combination with a binder material.

12. The method according to claim 1, wherein the ductile region includes abrasive particles.

13. The method according to claim 1, wherein the binding material includes a material having thermal properties able to absorb differential thermal expansion within the binder layer materials, during use of the blade.

14. The method according to claim 1, wherein the binding material includes a hard braze material.

15. The method according to claim 14, wherein the hard braze material is a nickel braze material.

16. The method according to claim 14, wherein the hard braze material is provided in a region of the binding layer which is exposed during use of the blade, and which includes abrasive particles.

17. The method according to claim 1, wherein the abrasive particles are mixed with the binding material for delivery.

18. The method according to claim 1, wherein the abrasive particles are delivered separately from the binding material.

19. The method according to claim 18, wherein the abrasive particles are delivered only when the binder layer is sufficiently fully formed to leave the abrasive particles exposed at the edge of the finished blade.

20. The method according to claim 1, wherein the abrasive particles are a super abrasive material.

21. The method according to claim 1, wherein the abrasive particles are made from a mixture of different materials.

22. The method according to claim 1, wherein the abrasive particles are cubic boron nitride, diamond or tungsten carbide.

23. The method according to claim 1, wherein the abrasive particles are coated to promote binding with the binding layer.

24. The method according to claim 23, wherein the abrasive particles are coated by a physical vapor deposition or chemical vapor deposition technique.

25. The method according to claim 23, wherein the abrasive particles are coated with a material which promotes wetting of the abrasive particles by the binding material.

26. The method according to claim 1, wherein the binding material includes a constituent which has a characteristic tuned to the radiation, to promote rapid heating within the binding material when exposed to the radiation.

27. The method according to claim 26, wherein the radiation is tuned to an absorption peak of the tuned constituent.

28. The method according to claim 1, wherein the at least one formation condition is varied to vary an adhesive or bonding property and/or a thermal property and/or a mechanical property of the binder layer.

29. The method according to claim 1, wherein the shear modulus of the binder layer is varied.

30. The method according to claim 1, wherein the backing strip is steel.

31. The method according to claim 1, wherein the backing strip is formed with tooth roots along the edge of the strip, prior to the formation of the binder layer.

* * * * *